(12) United States Patent
Apostolopoulos et al.

(10) Patent No.: US 6,667,698 B2
(45) Date of Patent: Dec. 23, 2003

(54) DISTRIBUTED COMPRESSION AND TRANSMISSION METHOD AND SYSTEM

(75) Inventors: John G. Apostolopoulos, San Carlos, CA (US); Gregory W. Wornell, Wellesley, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/107,927

(22) Filed: Mar. 25, 2002

(65) Prior Publication Data

US 2003/0179113 A1 Sep. 25, 2003

(51) Int. Cl.[7] ............................................... H03M 7/34
(52) U.S. Cl. ........................................ 341/51; 341/67
(58) Field of Search ............................... 341/51, 50, 67

(56) References Cited

U.S. PATENT DOCUMENTS 5,558,339 A  *  9/1996  Perlman ..................... 463/42

\* cited by examiner

*Primary Examiner*—Brian Young
*Assistant Examiner*—Joseph Lauture

(57) ABSTRACT

A compression and transmission method and system for use to communicate information from a first device to a second device in a network of devices. First, the first device receives information to be communicated to the second device. Second, the first device compresses the information to be communicated by employing prior information of the first device and prior information of the second device. The compressed information is then transmitted to the second device.

25 Claims, 9 Drawing Sheets

DISTRIBUTED COMPRESSION AND TRANSMISSION METHOD AND SYSTEM

FIELD OF THE INVENTION

The present invention relates generally to communication of information, and more particularly, to a method and system for compressing information for a current device based on either previous information of the current device or previous information of another device that is coupled to the current device through a shared communication medium.

BACKGROUND OF THE INVENTION

One system design consideration is the reduction of bandwidth needed to communicate information across a network. Since the bandwidth of the communication medium is limited, it is desirable for the system to reduce the bandwidth needed to communicate information as much as possible. A particularly challenging application is the transmission of video over wireless networks. Even when video is compressed, there is a valid concern of the use of excessive bandwidth, especially to transmit the same, similar, or related content by many devices in a network. Consider the problem of N devices in the network attempting to communicate exactly the same information. Current approaches require N times the amount of bandwidth needed for one device to communicate the information. As can be appreciated, it would be desirable to decrease the amount of bandwidth needed for such a situation.

As an example, consider the case of three people with three video cameras capturing a scene. All three cameras are seeing different portions of the same scene. Therefore, compressing the video while accounting for the information available to all the cameras can require significantly fewer resources than the conventional approach where each camera performs an independent compression using only its own information.

A second system design consideration is the reduction of the power needed by the transmitting device to communicate information. Since the devices are typically a portable device that requires the use of a portable power supply, such as batteries, any design should consider how to increase the life of the batteries by reducing the amount of power that is needed to transmit information.

Based on the foregoing, there remains a need for a method and system for a mechanism to provide efficient communication between a sender and a receiver across a shared communication medium that overcomes the disadvantages set forth previously.

SUMMARY OF THE INVENTION

In accordance with the invention, a compression and transmission method and system for use to communicate information from a first device to a second device in a network of devices are described. First, the first device receives information to be communicated to the second device. Second, the first device compresses the information to be communicated by employing prior information of the first device and prior information of the second device. The compressed information is then transmitted to the second device.

In one embodiment in accordance with the invention, the devices are connected via a shared communication medium, and a single device transmits at any one time. When the transmitting device is transmitting, all the other devices (i.e., non-transmitting devices) are in receive mode. During receive mode the non-transmitting devices listen to, record, and may also decode the information received from the transmitting device, which is coupled to the non-transmitting devices through the shared communication medium. A current device awaits a transmission slot. During transmit mode, the current device receives information to be transmitted (e.g., a live video feed or audio feed), encodes the information based on either previous information from the current device, previous information from another device, or the previous information from the current device and one or more other devices, and transmits the encoded information through the shared communication medium. During transmission, all the non-transmitting devices are in receive mode.

In another embodiment in accordance with the invention, a compression and transmission system is described. A plurality of devices is coupled together through a network (e.g., the Internet). Each device includes a decoder and an encoder. During a receive mode, the current device employs the decoder to decode all the information that is transmitted by the other devices that are coupled to the current device through the shared communication medium. During a transmit mode, the current device employs the encoder to encode the information to be transmitted based on either previous information transmitted by the current device or previous information transmitted by the other devices in the network.

Other features and advantages of the present invention will be apparent from the detailed description that follows.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

A method and system for compressing and communicating information between a first device and a second device that are coupled through a shared medium are described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Figure 1:
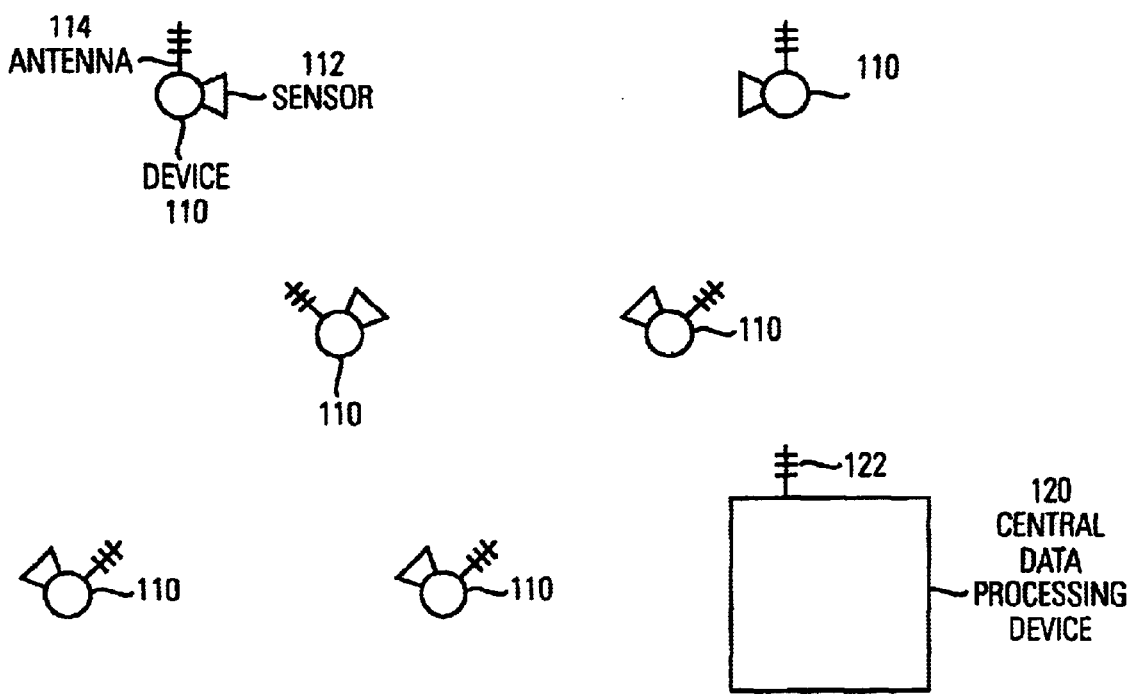
FIG. 1 illustrates a distributed system of devices with sensors in which the compression and transmission mechanism according to one embodiment of the present invention can be utilized.

FIG. 1 illustrates a distributed system of devices with sensors in which the compression and transmission mechanism according to one embodiment of the present invention can be utilized. The device 110 receives and decodes all the transmitted information from the other devices. This information is then stored in a memory.

When the device 110 transmits information, the device 110 encodes the information to be transmitted based on all, some, or none of the prior information transmitted from all the devices. For example, the prior information of other encoders may be selectively utilized for the current encoding task for the current encoder based on how useful the prior information is to the encoding. When none of the prior information of other devices is available or useful for the encoding, then only the prior information of the current encoder is utilized for the encoding.

One novel aspect of the present invention is that each of the distributed nodes can produce improved compression by using both it's own prior information and the prior information that has been distributed by other nodes or any other prior information that may be available to the current node's encoder. For example, other prior information can be information stored in a file that is accessible one or more of the distributed nodes.

Prior information can include, but is not limited to, previous frames (e.g., previous reconstructed frames), compressed bitstreams, coding parameters, background images (often referred to as sprites), and information that expresses the relationship between the data captured by the two nodes (e.g. perspective transformation parameters expressing the relationship between the video captured by the two separate nodes).

Figure 2:
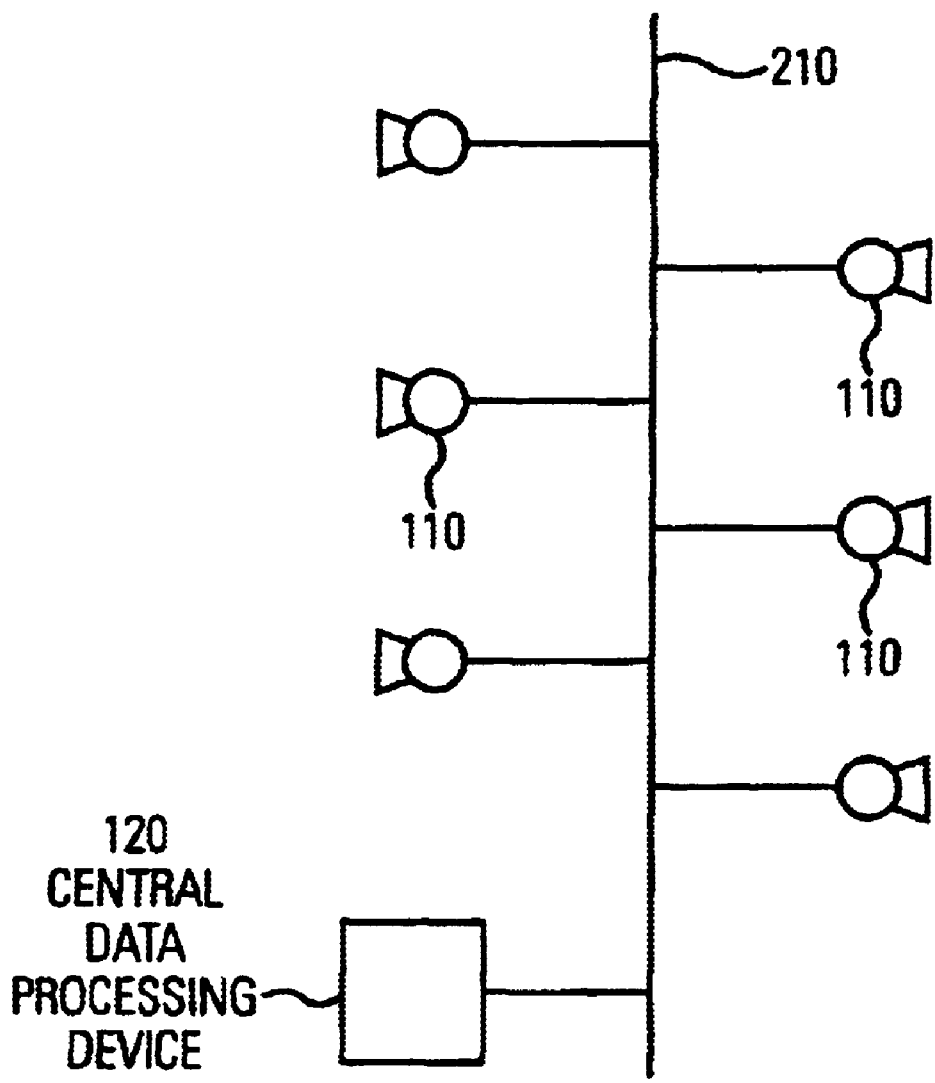
FIG. 2 is a block diagram that illustrates how the devices share a single communication medium in accordance with a preferred embodiment of the present invention.

FIG. 2 is a block diagram that illustrates how the devices share a single communication medium in accordance with one embodiment of the present invention. The shared 210 can be a wired communication medium or a wireless communication medium. For example, the communication medium 210 can be a local area network (LAN) or a wireless network, such as a cellular network (3G), wireless LAN, etc. Preferably, the shared communication medium supports a communication protocol that allows each device to take turns in transmitting. When a device is transmitting, all the other devices are listening, possibly decoding, and storing the transmitted device.

The communication protocol can, for example, be a time division multiple access (TDMA) protocol or a protocol that employs polling from a central data processing facility. The communication protocol can be a fair protocol (where each device receives a "fair" time to transmit) or a prioritized protocol (where certain devices in the network are afforded greater opportunity to transmit information).

Figure 3:
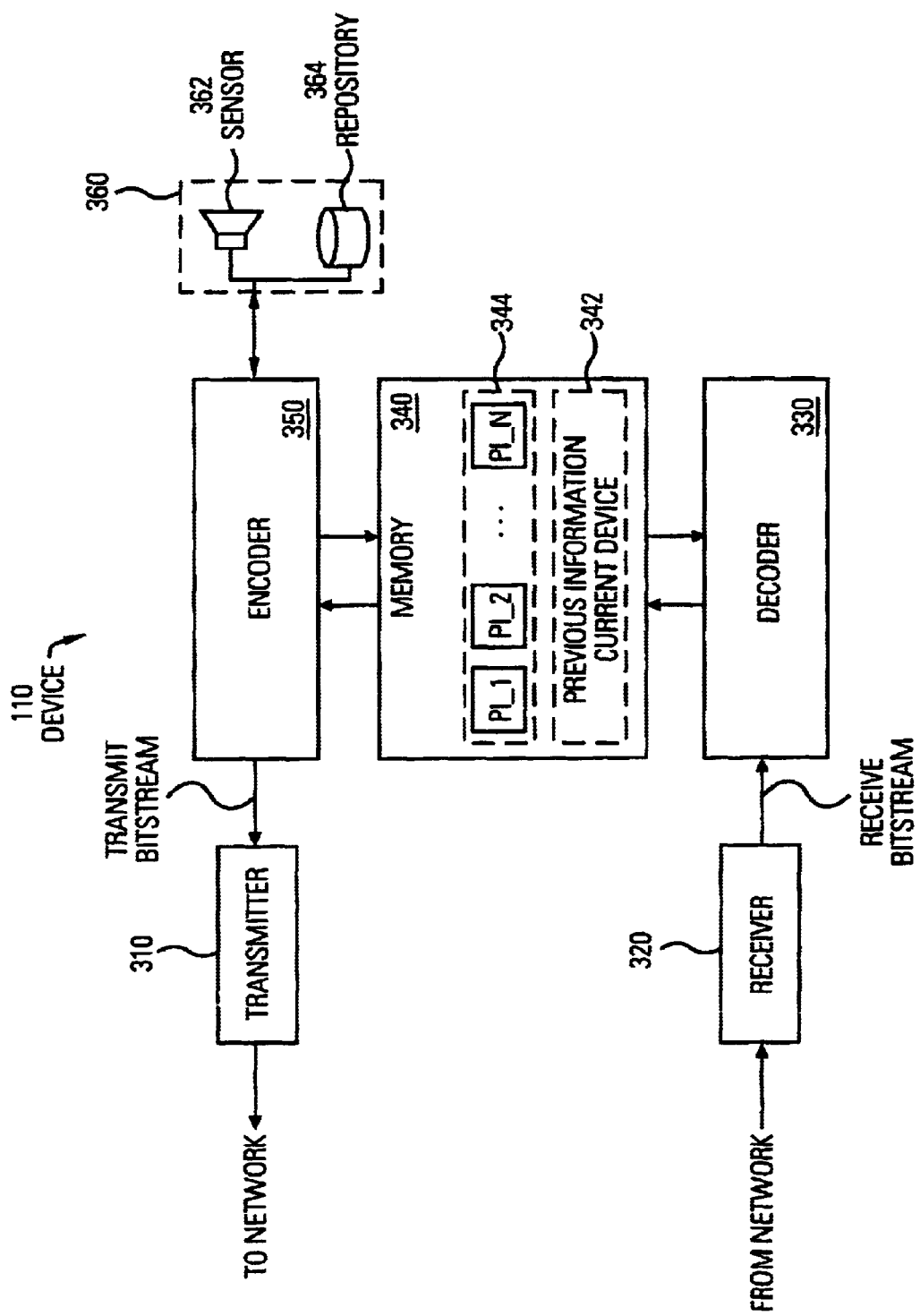
FIG. 3 is a block diagram illustrating in greater detail the configuration of the device of FIG. 1 in accordance with one embodiment of the present invention.

FIG. 3 is a block diagram illustrating in greater detail the configuration of the device 100 of FIG. 1 in accordance with one embodiment of the present invention. The device 110 of the present invention provides an efficient encoding and transmission mechanism.

The device 110 can include a transmitter 310 for transmitting information across the shared communication medium and a receiver 320 for receiving information from the shared communication medium. The construction and use of the transmitter 310 and the receiver 320 are known to those of ordinary skill in the art. The device 110 also includes a decoder 330 for receiving a bit stream from the receiver 320 and based on the received information for recovering the original information (e.g., the original video information).

The device 110 has a memory 340 for storing previous information 342 of the current device and previous information 344 (e.g., prior information for a first device (PI_1), prior information for a second device (PI_2), ..., and prior information for a Nth device (PI_N)) of other devices connected to the current device through the shared communication medium. For example, memory 340 can store one or more previous frames of video information for the current device and one or more previous frames of video information corresponding to prior transmissions of each of the devices coupled to the shared communication medium.

The device 110 also includes an encoder 350 for receiving information to be transmitted by the current device and previous information from the memory 340. Based on these inputs, the encoder 350 generates an encoded version of the information based on either the previous information of the current device or on previous information of other devices coupled to the shared communication medium.

The device 110 has two modes: 1) a receive mode and 2) a transmit mode. During the receive mode, the current device 110 employs the decoder 330 to decode all the information that is received from the other devices that are coupled to the current device 110 through the shared communication medium. During the transmit mode, the current device 110 employs an encoder 350 to encode the information to be transmitted based on either previous information transmitted by the current device, previous information transmitted by one or more of the other devices in the network, or both the previous information of the current device and the previous information of one or more of the other devices in the network.

In accordance with the invention, compression is performed based on previous compressed data from all available encoders. This contrasts with conventional approaches where a particular encoder performs compression based only on its own previous compressed data. Therefore, the encoder in accordance with the invention stores all or a subset of the compressed data from all available encoders, and then appropriately searches through this previously compressed data to determine which portions are useful to encode the current data. As an example, if N video signals are being captured and encoded by N encoders, each encoder may store the previously decoded frame from each encoder, for a total of N frame stores. It is noted that these frames may be stored in compressed or uncompressed format. Alternatively, the encoder may choose to store two or more frames from each available encoder.

The device 110 also includes an information source 360 for providing information to be transmitted to the encoder 350. The information source 360 can be a sensor 362 (e.g., a video camera or a microphone) for observing the surroundings of the device 110 and for providing the observed data. Alternatively, the information source 360 can be a repository 364 of previously recorded information (e.g., audio information, video information, multimedia information, etc.).

It is noted that the components of the device 110 as illustrated in FIG. 3 may be implemented in a central data-processing facility (e.g., the central data processing device 120 shown in FIGS. 1 and 2). In this embodiment, the central data-processing facility receives and decodes all the information from all the other devices and stores the information. The central data-processing facility may also perform other data processing on the stored information. When the central data-processing facility transmits information to the other devices, the central data-processing facility encodes the information to be transmitted based on all the prior information transmitted from all the devices.

Figure 4:
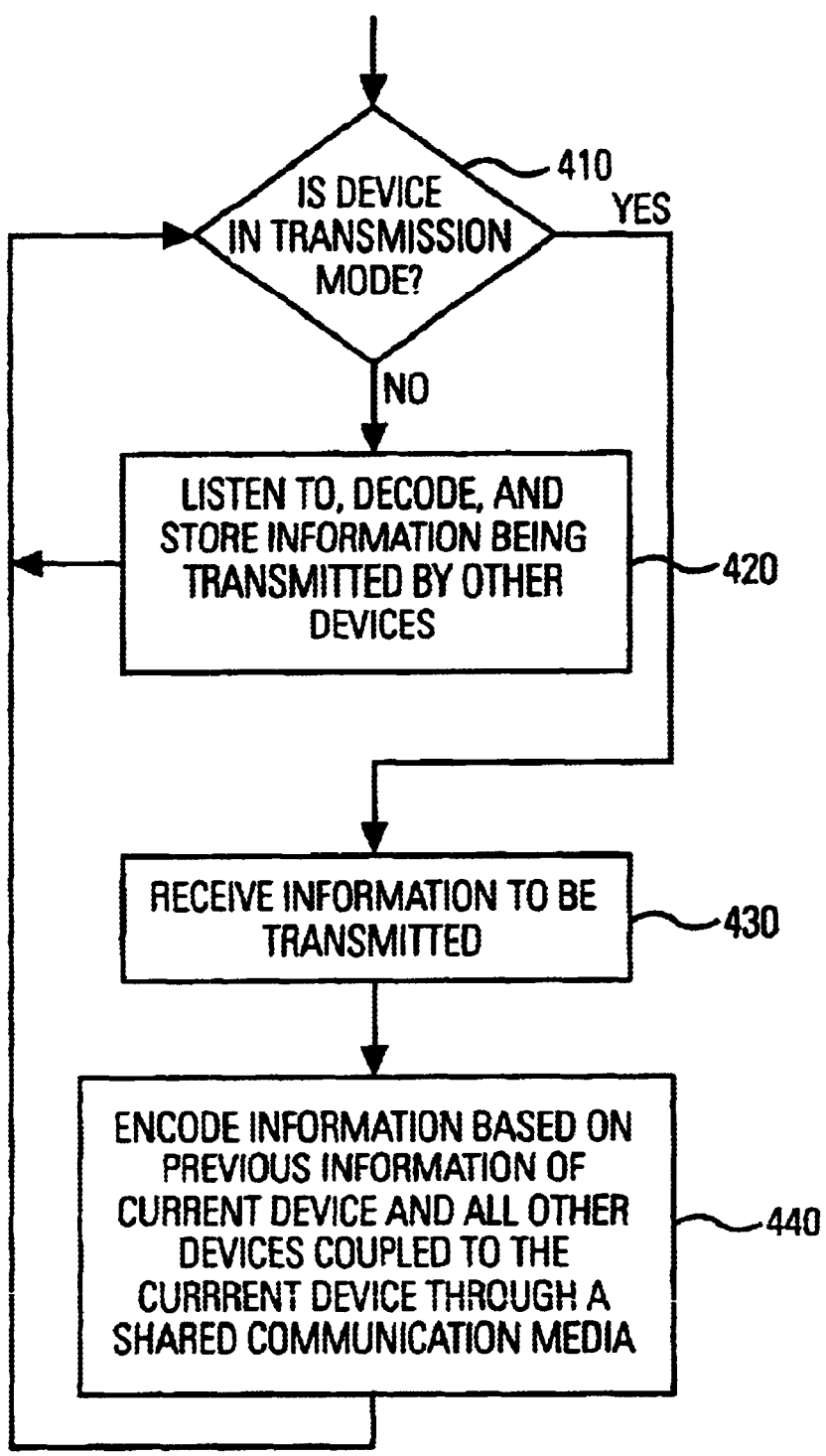
FIG. 4 is a flow chart illustrating the processing step performed by the system of FIG. 1 in accordance with one embodiment of the present invention.

FIG. 4 is a flow chart illustrating the processing step performed by the system of FIG. 1 in accordance with one embodiment of the present invention. In decision block 410, a determination is made whether the current device is in transmission (TX) mode. When it is determined that the current device is not in transmission (TX) mode (i.e., the device is in receive mode), the processing proceeds to step 420. In step 420, the current device listens to, decodes, and stores at least a portion of the information (e.g., last frame of the transmission) being transmitted by the transmitting device. Processing then proceeds to decision block 410.

Otherwise, when it is determined that the current device is in transmission (TX) mode, the processing proceeds to step 430. In step 430, the current device receives the information to be transmitted. In step 440, the current device encodes the information to be transmitted based on 1) previous information of the current device (e.g., previous frames transmitted by the current device); 2) previous information of other devices coupled to the current device through the shared communication medium (e.g., previous frames transmitted by other devices); or 3) a combination thereof. Processing then proceeds to decision block 410.

Figure 5:
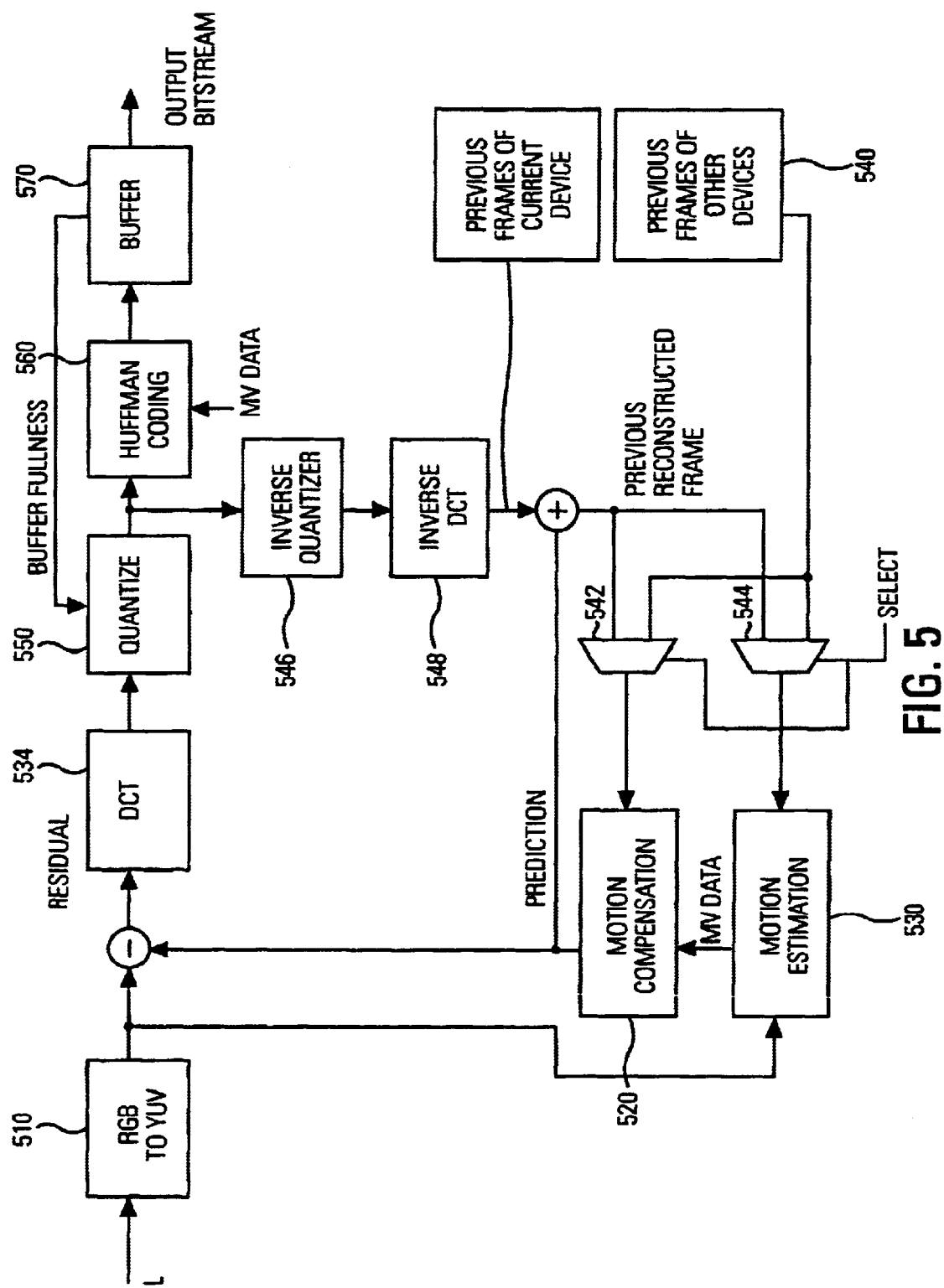
FIG. 5 illustrates in greater detail an encoder that is configured to utilize previous information of all devices in the encoding of information to be transmitted by a current device.

FIG. 5 illustrates in greater detail an encoder according to one embodiment of the present invention that is configured to utilize previous information of all devices in the encoding of information to be transmitted by a current device. The encoder 500 includes an RGB to YUV unit 510 for receiving an RGB signal and transforming the RGB signal into a luminance/chrominance color space (e.g., a YUV color space) in order to take advantage of the color space redundancy. The encoder 500 also includes a motion compensation unit 520 and a motion estimation unit 530 for exploiting the temporal redundancy by forming a prediction of the current frame based on a previously encoded frame.

The encoder 500 also includes a storage 540 for storing previous frames of other devices. The encoder 500 also includes a first multiplexer 542 for selectively providing one of a previously reconstructed frame and previous frame of the other devices from the storage 540 based on a select signal. The encoder 500 also includes a second multiplexer 544 for selectively providing one of a previously reconstructed frame and previous frame of the other devices from the storage 540 based on a select signal. The previous reconstructed frame for the current device can be generated by adding the prediction to the decoded error signal provided by an inverse quantizer 546 and an inverse DCT unit 548. The select signal can be generated based on different techniques to determine candidate frames for use in prediction that are described in greater detail hereinafter.

The encoder 500 also includes a DCT unit 534 for partitioning the prediction error or residual into 8×8 blocks and computing a 2-D DCT for each block. The encoder also includes a quantizer 550 for quantizing the DCT coefficients in an adaptive manner to exploit local video characteristics, human perception, and to meet any bit rate targets. The encoder 500 also includes a Huffman encoder 560 for performing Huffman encoding on the quantized coefficients and other information. The encoder 500 also includes a buffer 570 for coupling the variable bit rate output of the video encoder to a desired channel. This process may be accomplished by employing a buffer control mechanism where buffer fullness is used to regulate how coarse or how fine the coefficient quantization is and thereby the video rate.

One aspect of the present invention is the selection of previously encoded frames for use in prediction of the current encoded frame and the generation of the prediction error. First, all valid frames from all devices 1 to N are identified. Next, candidates for use in prediction are selected from the pool of valid frames. Techniques to select these candidates are described in greater detail hereinafter. Each candidate is checked to determine if the candidate provides good compression (e.g., producing a low prediction error). It is noted that an acceptable prediction error may be set to a predetermined error level or threshold.

It is noted that there are many ways to determine which previously encoded frames are good candidates for prediction (i.e., previously encoded frames that are likely to result in a low prediction error). Some examples of techniques to determine useful candidate frames include the use of geography, events, polling, user selection, and geometric transforms, such as perspective. The use of geography involves determining the geographic proximity of devices to each other (e.g., in the same room, at the same intersection, at the same store, within a particular range of a current device as determined by a global positioning satellite (GPS), etc.). The use of events involves determining whether the devices are at the same event (e.g., the same sporting event, the same conference, same concert, or the same room).

The polling technique may involve each device periodically polling the other devices and determining whether the previously encoded frames of the other devices are useful in producing a low prediction error. For example, the current device can poll the other devices every second or every minute to determine if other devices have begun to acquire the same images and frames. Preferably, a low resolution version (e.g., a 64×64 version of a 512×512 original) of the two subject frames are first generated (e.g., by applying a low pass filter and subsampler to the current frame to be encoded and by applying a low pass filter and subsampler to the previously encoded frame), and then a comparison is made of the low resolution versions of the current frame to be encoded with the previously encoded frames to determine the prediction error. By using the low-resolution versions of the frames, the time needed to perform the comparison is decreased and the complexity is decreased.

The user selection technique allows users of the devices to share resources. For example, friends at a concert or colleagues at a meeting can choose to select and specify one or more devices from the pool of devices as candidates for useful previously encoded frames.

In the geometric transform technique, a geometric transform is performed on the previously encoded frame before determining the prediction error. Examples of this technique are affine or perspective transform. An example of an application where this technique is useful is when there are two devices capturing video footage from the same scene except that the first device is closer to the object than a second device. In this case, the second device can employ a previously encoded frame from the first device for use in predicting a current frame when a "geometrically transformed" version of the previously encoded frame from the first device is first generated. The use of mathematical expressions to perform geometric transforms on images or frames is known by those of ordinary skill in the art and is not described further herein.

In addition, the prior history of which devices provide useful frames can be used to choose the most promising candidate frames to be checked first. For example, assume device_1 is in the process of coding its current frame, and it has access to the previously coded frames of devices_1 through device_N, but the previously coded frames of device_3 have been the most useful to device_1 in the past. Then, device_1 first examines its own previously coded frame and that of device_3 as potential good candidates, before examining the frames of the other devices.

In order to identify which devices provide good candidate frames for a given device, each device preferably keeps a running tally of the number of times that the frame(s) of each device were used. For example, if there are a total of N devices, then each device can keep a table of N entries, which contain the number of times that each of the N devices provided the best candidate.

Since portions (e.g. 16×16 pixel blocks) of a number of candidate frames may be used to encode the current frame, this table may describe the number of blocks from each candidate frame that were used to code the current frame. This running tally can be weighed to stress which devices were useful recently. For example, each entry in the table may be multiplied by a factor between 0 and 1 before adding the tallies for the current frame.

Although the encoding and decoding method and system of the present invention is described as employing the last frame (frame N—1) for prediction, it is noted that other previous frames (frame N–2, frame N–3, etc.) may be maintained and utilized to suit a particular application. Consider the example of an interview that is being videotaped. The camera that is providing the video-feed may be directed at the interviewer for several seconds and then pan to the person being interviewed and then pan to the interviewer and so forth. In such a situation, it would be advantageous to have access to previous frames other than the last frame especially when the camera angle changes (i.e., the camera pans from interviewer to person being interviewed and visa-versa).

For prediction techniques, which divide the frame into a plurality of blocks (e.g., 8×8 blocks or 16×16 blocks), it is noted that each block within the current frame can be predicted based on any other block of any previous frame of any device.

Figure 6:
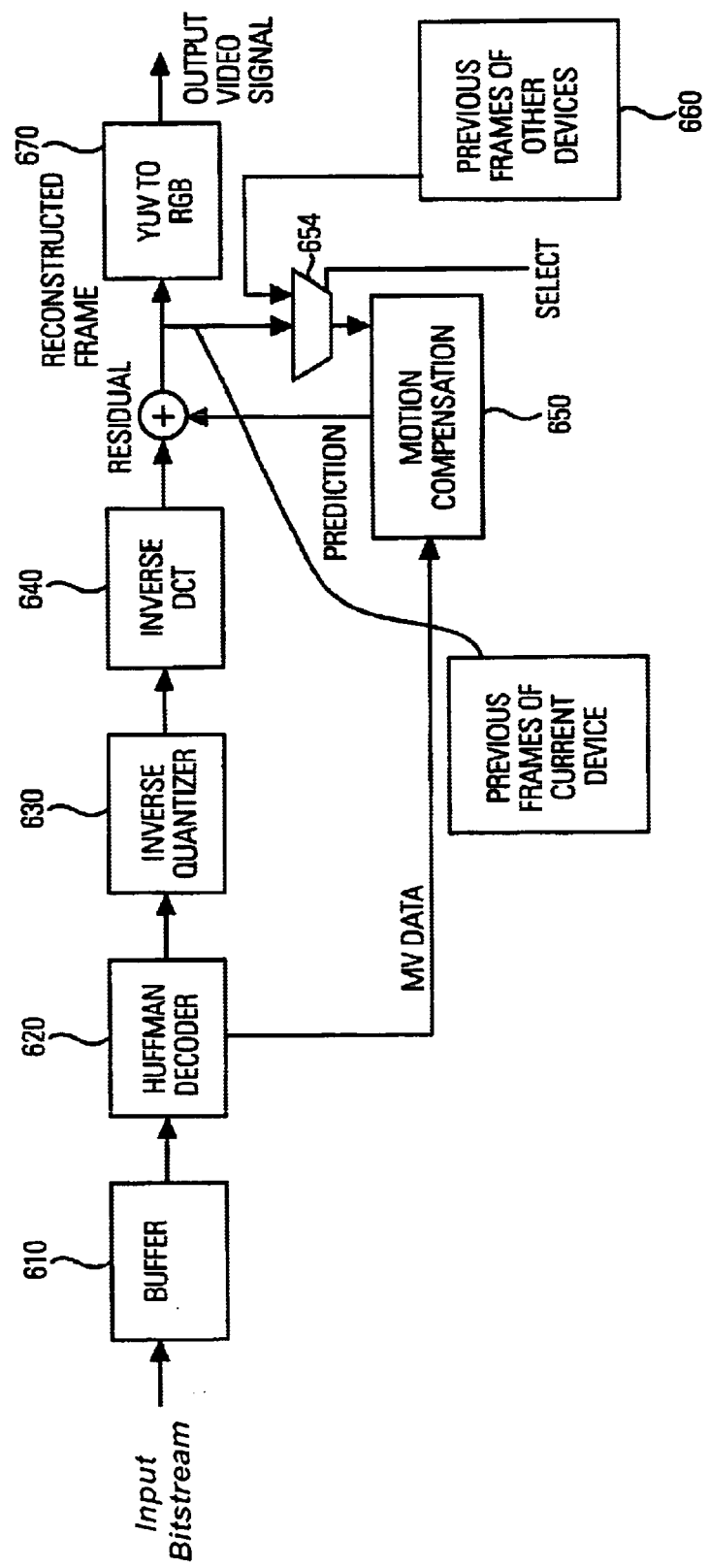
FIG. 6 illustrates in greater detail a decoder that is configured to utilize previous information of all devices in the decoding of information to be transmitted by a current device.

FIG. 6 illustrates in greater detail a decoder that is configured to utilize previous information of all devices in the decoding of information to be transmitted by a current device. It is noted that the video decoding process is the inverse of the encoding process. The decoder includes a buffer 610 for receiving and buffering an input bitstream, a Huffman decoder 620 for parsing the bitstream and decoding the Huffman encoding, an inverse quantizer 630 for identifying the non-zero DCT coefficients and performing inverse quantization thereon, an inverse DCT block 640 for performing an inverse DCT operation and generating a residual signal.

The decoder also includes a motion compensation unit 650 for receiving motion vector (MV) data and one of a previously reconstructed frame of the current device or a previously reconstructed frame from one of the other devices, and based thereon for generating a prediction (e.g., previously re-constructed frame).

The decoder also includes a multiplexer 654 for selectively providing one of a previously reconstructed frame of the current device or a previously reconstructed frame from one of the other devices based on a select signal. The select signal is provided by the encoder and specifies the previous frame employed to encode the current frame. The previously reconstructed frame from one of the other devices can be stored in a memory 660.

The residual signal is combined with the previously re-constructed frame to reconstruct the current frame. The decoder also includes a YUV to RGB unit 670 for receiving a YUV signal and transforming the YUV signal into an RGB color space to output an output video signal.

Figure 7:
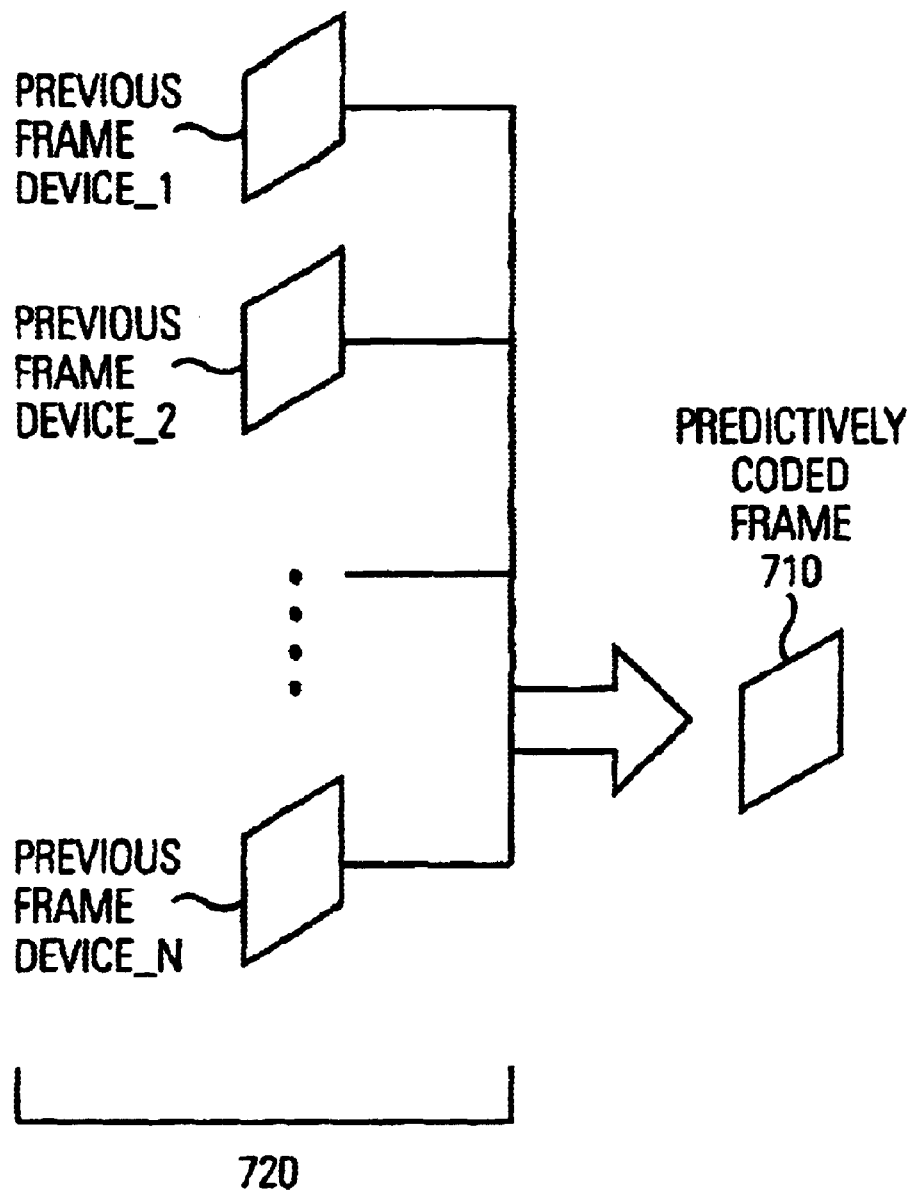
FIG. 7 illustrates how the encoder of FIG. 5 generates a predictively coded frame by using either the previous frame of the current device or the previous frames of other devices.

FIG. 7 illustrates how the encoder of FIG. 5 generates a predictively coded frame by using either the previous frame of the current device or the previous frames of other devices. A predictively coded frame 710 is generated based on one or more of the previously transmitted frames 720 corresponding to devices 1 to N, which are coupled via a shared communication medium. Consider the example, where device_2 is currently in transmission mode. In this example, the predictively coded frame 710 for device_2's transmission is generated by employing the previous frames 720 of one or more of the 1 to N devices. The frames that were previously transmitted by devices 1 to N may be stored in the storage 530 of FIG. 5. In contrast, the prior art generates the predictively coded frame 710 based only on the frames that were previously transmitted by device_2.

Figure 8:
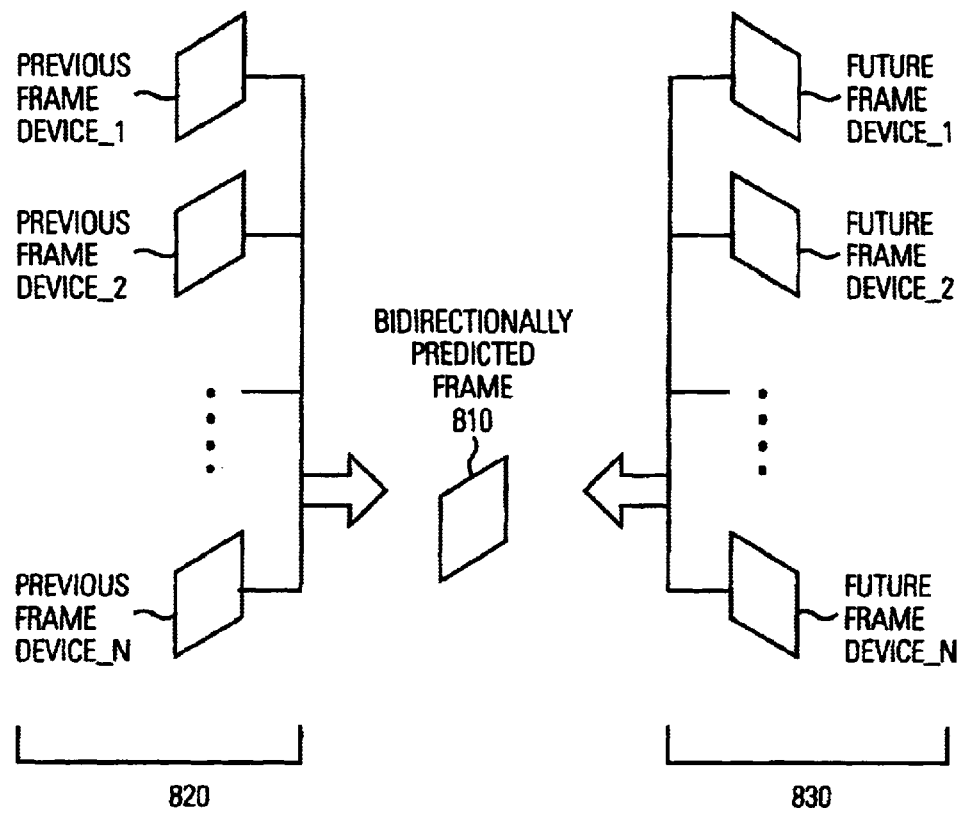
FIG. 8 illustrates how the encoder of FIG. 5 generates a bi-directionally predicted frame by using either the previous frame of the current device, the previous frames of other devices, the future frame of the current device, or the future frames of the other devices.

FIG. 8 illustrates how the encoder of FIG. 5 generates a bi-directionally predicted frame by using either the previous frame of the current device, the previous frames of other devices, the future frame of the current device, or the future frames of the other devices. Consider the example of three frames (i.e., frame_1, frame_2, and frame_3). Frame_1 can be encoded first as an I-frame (i.e., a frame that does not depend on any other frames). Frame_3 can then be encoded as a P-frame (i.e., a frame that depends on Frame_1). In this case, the prediction is performed by using the frame to be encoded (i.e., Frame_3) and a previously encoded frame (frame_1). Then, frame_2 can be encoded as a B-frame that depends on both frame_1 and frame_3.

The encoder of the present invention encodes a current frame as a B-frame by employing one or more previously encoded frames from device 1 to N and by employing one or more future encoded frames from device 1 to N. For example, a bi-directionally predicted frame 810 is generated based on one or more of the previously transmitted frames 820 and one or more future frames 830 corresponding to devices 1 to N, which are coupled via a shared communication medium. Consider the example, where device_N is currently in transmission mode. In this example, the bi-directionally predicted frame 810 for device_N's transmission is generated by employing the previous frames 820 and future frames 830 of one or more of the 1 to N devices. The frames that were previously transmitted by devices 1 to N and the future frames corresponding to devices 1 to N may be stored in the storage 530 of FIG. 5. In contrast, the prior art generates the bi-directionally predicted frame 810 based only on previous frames of device_N and future frames of device_N.

Figure 9:
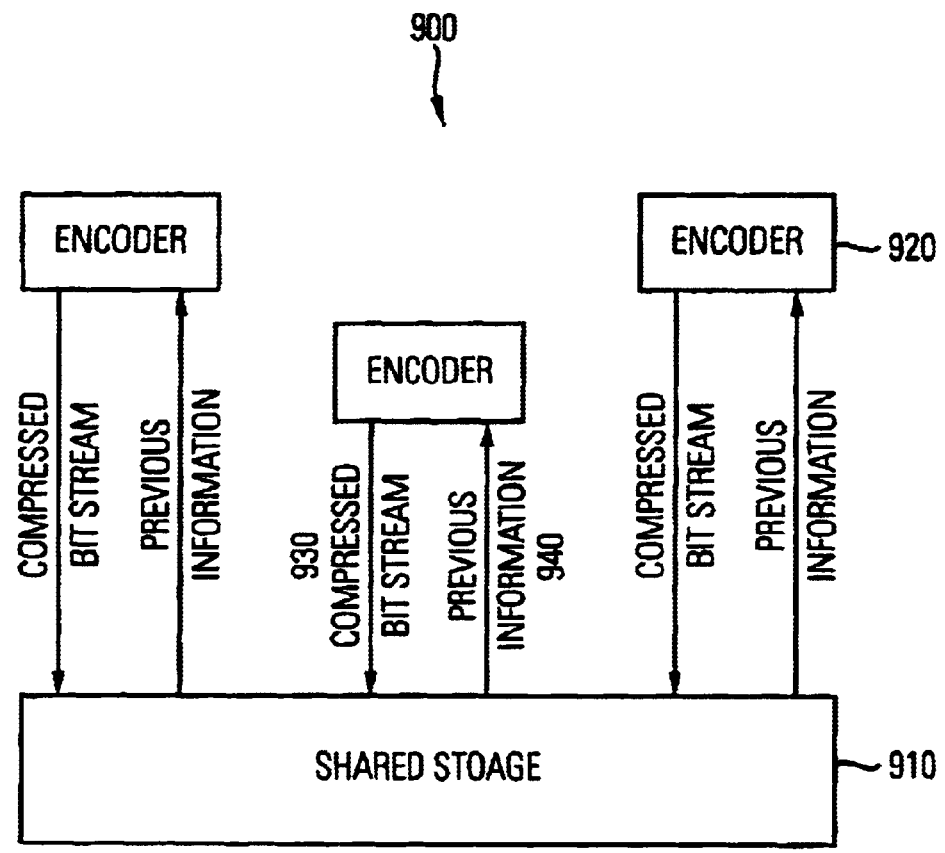
FIG. 9 illustrates a distributed compression system, where multiple devices use a shared storage medium, in accordance with one embodiment of the present invention.

FIG. 9 illustrates a distributed compression system 900, where multiple devices use a shared storage medium, in accordance with one embodiment of the present invention. The system 900 includes a shared storage 910 and a plurality of encoders 920 that are coupled to the shared storage 910. The shared storage 910 can store previous information of the encoders 920. Each encoder generates compressed bitstreams 930. These compressed bitstreams 930 are written to the shared storage 910 and become a repository of previous information 940. The previous information 940 can then be read by each of the encoders 920 and utilized for a current compression task (e.g., compressing a current frame).

Embodiment Where a Device Codes Based on Only Using Previously Coded Information From Other Devices and not on its own Previously Coded Information In an alternative embodiment, a device may only use the previously coded frames from another device. This embodiment is useful when the given device codes and transmits very rarely, but listens to other device(s). As used herein, the device that codes and transmits very rarely is referred to as the "quiet device". A device may be a "quiet device" for a number of reasons, including the fact that it may have limited power and therefore it is designed to save power until an event occurs that is necessary to transmit, when the device is designed to be in non-transmit mode until it is requested to transmit, as well as various surveillance cases.

Since the quiet device encodes and transmits very rarely, it may not have a previously coded frame that is useful for coding the current frame to be coded. Specifically, the last frame coded by the quiet device may be so old that it is useless for forming an accurate prediction of the current frame. However, in the proposed system, by listening to the transmissions of other devices the quiet device may receive a previously coded frame of another device that may be very helpful in coding the current frame to be coded by the quiet device.

The use of this previously coded frame from another device can dramatically improve the compression performance of the quiet device as opposed to the conventional operation of a quiet device where it would not have a recent previously coded frame for use in the compression. The dramatically improved compression performance would enable the quiet device to reduce the required transmission bit rate or transmission power and thereby improve its battery life. Alternatively, the improved performance may correspond to an improved reconstructed video quality at the decoder for the same total bit rate or the same total transmitted power. Therefore, one important mode of operation is where a given device only uses previously coded frames by other devices for forming the prediction of the current frame to be coded by the given device.

Selection Policy

In many circumstances it is beneficial to coordinate the policy that specifies which coded frames by which devices may be used as candidate frames for prediction by another device. For example, a policy, which specifies the candidate frames, limits the storage and also the search of valid frames, thereby limiting the complexity. Alternately, the policy can maximize the performance given a complexity constraint (e.g., a computation or storage constraint).

Many different types of policies may be generated. A simple policy is to only use the most recently coded frame from each device. Another policy is to only use a specific subset of previously coded frames from each device. For example, this policy could specify to always use the two most recently coded frames of device 1, and the one most recently coded frame of device 2, and the first frame coded by device 3. In addition, different subsets of devices may have different policies directing their operation. For example, device 2 may only be allowed to use previously coded frames of its own and of device 1, while device 3 may only be allowed to use previously coded frames of device 4.

A policy may be determined via negotiations among the various devices, may be specified by a single entity (e.g. a master device or a central data-processing device), may be specified by the decoding devices, or may be specified by the users. In this last case the users may know which devices will be coding related information and can use that knowledge to specify the policy. The policy may also be generated to account for differences in device capabilities such as encoding capabilities (e.g. frames/sec or bit rate), storage capability, transmission capability, and available power or battery life.

Embodiment: Multiple Devices Simultaneously Transmitting and Listening

The embodiment described previously focused on the case where only one device transmits at a time, and all the other devices listen. This embodiment provides a number of benefits including improved resource usage such as improved usage of a shared communication channel, e.g. wireless channel, or shared storage.

In an alternate embodiment, multiple devices or even all the devices may transmit at the same time and all of the devices may listen. In this case, when a given device is about to encode its information to transmit, it may use all of the prior transmitted information from all of the prior devices. In this case all of the devices may have their encoding synchronized to occur at the same time, synchronized to be offset from one another, or they may run asynchronously.

In this alternate embodiment, multiple devices may transmit at the same time, thereby using more resources (e.g., spectrum,) than when only one device is transmitting at a time. This embodiment may be more appropriate in certain circumstances. For example, if each of the devices is capturing a video signal and encoding it at a low frame rate (e.g., 1–5 frames/sec.), then having access to other coded frames may assist in the compression. As a specific example, consider the case when 3 devices are capturing and encoding a video scene and that their coding processes are synchronized to be offset from each other, then device #1 may encode frames 1,4,7,10 . . . , device #2 may encode frames 2,5,8,11 . . . , and device #3 may encode frames 3,6,9,12 . . . . In the conventional coding approach where each device only codes its current frame based on its own previously coded frames, then each device would be limited to coding each frame based on a prior frame three frames back, e.g. device #1 would encode frame 7 based only on frames 4 and 1. However in the embodiment of the present invention, each device would listen to and receive intermediate frames, which it can use to perform significantly improved compression.

For example, device #1 in the proposed approach has listened and has access to frames 1,2,3,4,5,6 to use in coding frame 7. In particular, having access to more recent prior frames (e.g. frame 6 in this case) can lead to significantly improved compression over the conventional case where the device only has access to a more distant frame (e.g. frame 4)

It is noted that the compression technique of the present invention may be built on top of components from current video compression standards, such as H.261 (video telephony and teleconference over ISDN), MPEG-1 (video on digital storage media (CD-ROM)), MPEG-2 (digital television), H.263 (video telephony over PSTN), and MPEG-4 (object-based coding, synthetic content, interactivity) or employed to develop new compression standards.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A method for communicating data over a network that has at least a first device and a second device that includes prior information, the method comprising the steps of:
    the first device receiving the information to be communicated to the second device;
    the first device compressing the information by employing the prior information of the second device; and
    the first device transmitting the compressed information over the network.

2. The method of claim 1 wherein the step of the first device compressing the information by employing the prior information of the second device includes the steps of
    receiving the prior information of the first device;
    receiving the prior information of the second device; and
    employing one of the prior information of the first device, the prior information of the second device, and both prior information of the first device and the prior information of the second device to compress the information to be communicated.

3. The method of claim 1
    wherein the step of the first device compressing the information by employing the prior information of the second device includes the first device encoding the information by employing a last decoded frame of the second device; and
    wherein the step of the first device transmitting the compressed information to the second device includes the first device transmitting information for specifying a particular decoded frame utilized for the compression to second device.

4. The method of claim 1
    wherein the step of the first device compressing the information by employing the prior information of the second device includes the first device employing a last decoded frame of the second device to form a prediction of a current frame to be encoded; and
    wherein the step of the first device transmitting the compressed information to the second device includes the first device transmitting information for specifying that the last decoded frame of the second device is utilized for the compression to second device.

5. The method of claim 1
    wherein the step of the first device compressing the information by employing the prior information of the second device includes the first device generating a bi-directionally predicted frame by employing at least two previously decoded frames of the first device, at least two previously decoded frames of the second device, or a previously decoded frame of the first device and a previously decoded frame of the second device to form a prediction of a current frame to be encoded; and wherein the step of the first device transmitting the compressed information to the second device includes the first device transmitting information for specifying that the previously decoded frames are utilized for the compression to second device.

6. The method of claim 1 wherein the network is a local area network.

7. The method of claim 6 wherein the local area network is one of a wireless local area network, a wireless local area conforming to IEEE 802.11 specifications, and a local area network conforming to a Bluetooth specifications.

8. The method of claim 1 wherein the network is one of a packet network, a cellular telephone network, an Internet, and an Intranet.

9. The method of claim 1 wherein the prior information of the first device includes one of previous frames, previous reconstructed frames, compressed bitstreams, coding parameters, background images, information that expresses the relationship between data captured by two different devices, and perspective transformation parameters expressing the relationship between the video captured by two different devices.

10. The method of claim 1 wherein the prior information of the second device includes one of previous frames, previous reconstructed frames, compressed bitstreams, coding parameters, background images, information that expresses the relationship between data captured by two different devices, and perspective transformation parameters expressing the relationship between the video captured by two different devices.

11. The method of claim 1 wherein the information to be communicated is one of text information, file information, video information, audio information, voice information, and multimedia information.

12. The method of claim 1 wherein the information to be communicated is one of time sensitive information, time-sensitive video information, time-sensitive video information, and time-sensitive voice information, and time-sensitive multi-media information.

13. A compression system comprising:
    a first encoder for generating at least one encoded frame of data;
    a second encoder for performing compression by employing the encoded frame of data generated by the first encoder; and
    a shared storage coupled to the first encoder and the second encoder for storing the encoded frame of data generated by the first encoder.

14. The compression system of claim 13 wherein the first encoder generates a plurality of encoded frames of data; wherein the shared storage stores all or a subset of the encoded frames of data provided by the first encoder.

15. The compression system of claim 13 wherein the first encoder generates a plurality of previously encoded frames of data; the system further comprising:
    a search mechanism for searching through the previously encoded frames of data to determine which portions are useful to encode the current data.

16. The compression system of claim 15 wherein the previously encoded frames of data are stored in one of a compressed format or an uncompressed format.

17. The compression system of claim 13 wherein the shared storage stores at least one previously decoded frame from each encoder.

18. The compression system of claim 13 wherein the shared storage stores at least two previous frames from each encoder.

19. The compression system of claim 13 further comprising:
- a transformation unit for modifying a previously coded frame prior to using the previously coded frame to form a prediction.

20. The compression system of claim 13 further comprising:
- a candidate selection unit for selecting useful candidate frames based on a predetermined criteria.

21. The compression system of claim 20 wherein the predetermined criteria is one of geography, events, polling, and user selection.

22. The compression system of claim 13 further comprising:
- a fast search unit for performing a fast search of useful candidate frames by generating a low resolution version of the chosen candidate frames and the current frame; performing an initial search on the low resolution frames; and when the initial search produces promising results, performing a search on the full resolution versions of the frames.

23. A compression system comprising:
- a first encoder for generating at least one encoded frame of data;
- a second encoder for performing compression by employing the encoded frame of data generated by the first encoder; and
- a shared communication medium coupled to the first encoder and the second encoder for use by the first device and the second device to communicate information therebetween.

24. A method for receiving information over a network that has a plurality of devices wherein each device has prior transmitted information, the method comprising the steps of:
- receiving compressed information and encoding information; and
- accessing prior transmitted information of at least one device other than the receiving device; and
- in response to the compressed information, the encoding information, and prior transmitted information of at least one device other than the receiving device, decoding the compressed information.

25. The method of claim 24 wherein the prior transmitted information of the first device includes one of previous frames, previous reconstructed frames, compressed bitstreams, coding parameters, background images, information that expresses the relationship between data captured by two different devices, and perspective transformation parameters expressing the relationship between the video captured by two different devices.

* * * * *